United States Patent [19]

Kosugi et al.

[11] Patent Number: 4,676,631
[45] Date of Patent: Jun. 30, 1987

[54] DEVICE FOR ADJUSTING PROJECTION MAGNIFICATION

[75] Inventors: Masao Kosugi; Ichiro Kano, both of Yokohama, Japan

[73] Assignee: Canon Kabushiki Kaisha, Tokyo, Japan

[21] Appl. No.: 868,147

[22] Filed: May 29, 1986

[30] Foreign Application Priority Data

May 31, 1985 [JP] Japan ............... 60-119435

[51] Int. Cl.⁴ ............................ G03B 27/52
[52] U.S. Cl. ........................ 355/55; 355/53
[58] Field of Search ............. 355/55, 53, 30; 354/195.1

[56] References Cited

U.S. PATENT DOCUMENTS

| 4,084,903 | 4/1978 | Pircher | 355/53 |
| 4,298,273 | 11/1981 | Nishizuka et al. | 355/53 X |
| 4,477,183 | 10/1984 | Kawamura et al. | 355/55 |
| 4,496,239 | 1/1985 | Isohata et al. | 355/53 X |
| 4,506,977 | 3/1985 | Sato et al. | 355/55 X |
| 4,537,498 | 8/1985 | Banks et al. | 355/55 |
| 4,583,840 | 4/1986 | Yabu et al. | 355/55 X |

FOREIGN PATENT DOCUMENTS 28613 2/1985 Japan .

Primary Examiner—Richard A. Wintercorn
Attorney, Agent, or Firm—Fitzpatrick, Cella, Harper & Scinto

[57] ABSTRACT

A device for adjusting projection magnification of a projection lens usable in a process of manufacture of semiconductor devices to project an image of a pattern of a reticle onto a semiconductor wafer. The device includes at least one plane glass plate to form a substantially closed space at the semiconductor wafer side of the projection lens system. Pressure in the space is controlled to control deformation of the glass plate to thereby adjust the projection magnification.

13 Claims, 13 Drawing Figures

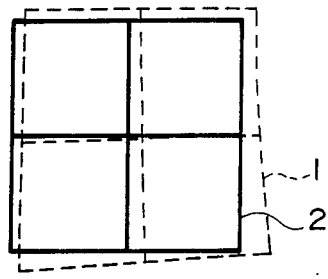
FIG. IA
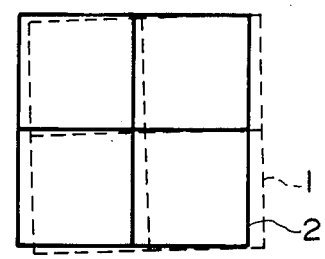
FIG. IB
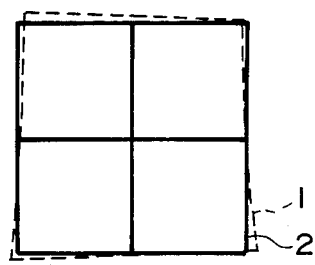
FIG. IC
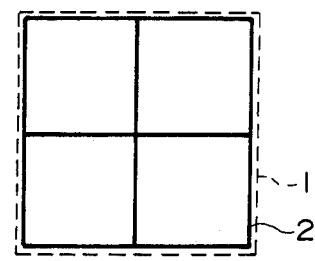
FIG. ID 4,676,631

DEVICE FOR ADJUSTING PROJECTION MAGNIFICATION

FIELD OF THE INVENTION AND RELATED ART

This invention relates to a device for adjusting projection magnification of a projection optical system. More particularly, the invention is concerned with a device for adjusting projection magnification of an optical system such as, for example, usable in one of the processes of manufacture of semiconductor devices such as integrated circuits, for projecting an image of a pattern of a reticle or mask onto a semiconductor wafer.

Manufacture of semiconductor devices includes a photolithographic process which is repeated to superimposingly print different kinds of patterns on a silicon wafer, as well as other manufacturing processes such as an impurity diffusing process, an etching process, an oxidization process and so on which are effected each time patterns of the same kind are printed on the silicon wafer. In the field of manufacture of the semiconductor devices which are called also integrated circuits, and as implied by the words "integrated circuits", what is important is the density of functional elements such as transistors, capacitances, etc. per unit area of the wafer. To improve the density was and is one of the most important objects in the field of manufacture of semiconductor devices.

Major factors contributing to improvements in the density or the degree of integration are resolving power of a projection optical system, provided in a semiconductor device manufacturing exposure apparatus to project an image of a pattern onto the wafer, and accuracy of superposing the image of the pattern being projected upon a pattern already printed on the wafer. FIG. 1A shows an example of an error in superposing a pattern 1, being projected, onto a pattern 2 already printed on a wafer. In general, the superposition error (pattern overlay error) such as shown in FIG. 1A is chiefly caused by misalignment (alignment error) between the patterns 1 and 2 such as shown in FIG. 1B and by errors in image formation due to distortion, such as shown in FIG. 1C, and a magnification error such as shown in FIG. 1D. As for the former, i.e. the misalignment, there is a possibility that the error is corrected by adjusting (i.e. aligning) the relative position of the wafer and a reticle or photomask (hereinafter simply "reticle") on which the pattern 1 is formed. However, as for the latter, i.e. the errors in image formation due to the distortion and the magnification error, they can not be corrected by the adjustment of the relative position of the reticle and the wafer. Nevertheless, to avoid or suppress such errors in image formation is very desirable in the current exposure apparatuses. The contortion (by an amount $\delta$) of the projected image of the pattern 1 can be divided into a magnification error component which appears symmetrically with respect to the optical axis of the projection optical system and which is linearly proportional to the radial distance R from the optical axis, and a distortion component. In recent lens projection type optical systems, the contortion $\delta$ including these components is suppressed to an order of about 0.2 micron. This means however that, if plural lens projection type optical systems are used (that is, plural exposure apparatuses are used) in the semiconductor device manufacturing processes, there is a possibility of occurrence of a superposition error of 0.4 micron (maximum).

On the other hand, in a case where the accuracy of the order described above should be considered significant, it is known that the projection magnification of the projection lens system changes due to a change in refractive index of an air surrounding the projection lens system which change is caused by a change in ambient pressure. As an attempt to meet this problem, it has been proposed in Japanese Laid-Open Patent Application, Laid-Open No. 28613/1985 that pressure in a closed space defined by two single-lenses of a projection lens system and a supporting metal is adjusted to change the refractive index (relative refractive index of the glass and air) thereby to correct the projection magnification. According to this method, however, a relatively high pressure is required which leads to a high possibility that the pressure acting on the single lens causes deformation of the surface of the lens that has been shaped extraordinarily precisely. Therefore, it is possible that the correction of the projection magnification adversely affects other optical characteristics of the projection lens system.

SUMMARY OF THE INVENTION

It is accordingly a primary object of the present invention to provide a device for adjusting projection magnification of a projection optical system without adversely affecting other optical characteristics of the projection optical system.

It is another object of the present invention to provide a device for adjusting projection magnification of an optical system for projecting, in a process of manufacture of semiconductor devices, an image of a pattern of a reticle onto a wafer, wherein any error in the projection magnification due to a change in ambient pressure of the projecting optical system can be satisfactorily corrected.

Briefly, according to the present invention, there is provided a device for adjusting magnification in projecting an image of a pattern of a first object onto a second object, said device comprising: means for optically projecting the image of the first object onto the second object; means for forming a substantially closed space at a position on an optical path of said projecting means and between the first and second objects, said forming means having at least one plane glass plate contributable to form said space; and adjusting means for changing pressure in said space to deform said at least one glass plate to thereby change the magnification of image projection.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1D are schematic views showing errors in superposing an image of a pattern, being projected, upon a pattern formed on an object.

DESCRIPTION OF THE PREFERRED EMBODIMENTS

Figure 2A:
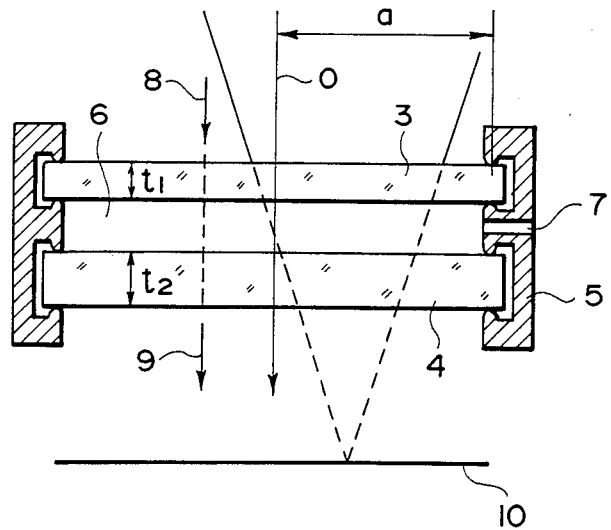
FIGS. 2A and 2B are principle views, respectively, showing the manner of adjustment of the projection magnification in accordance with the present invention.
Figure 2B:
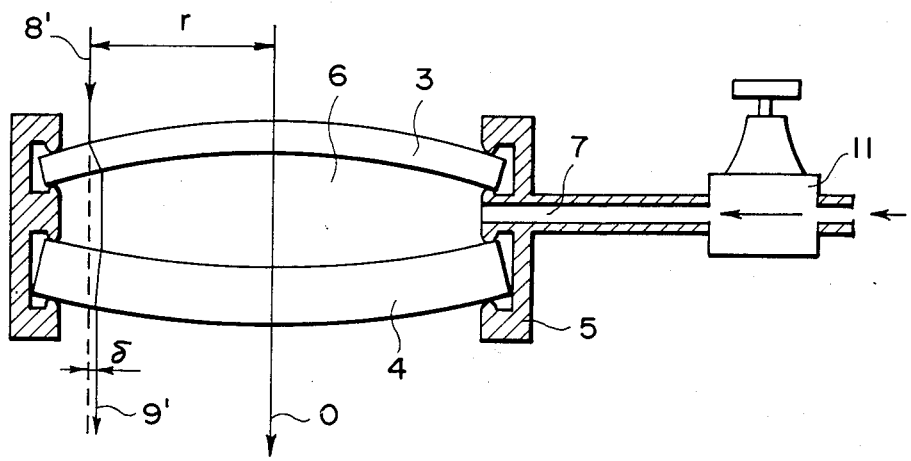

Referring now to FIGS. 2A and 2B, there is schematically shown the principle of adjustment of projection magnification in accordance with the present invention. In FIGS. 2A and 2B, a parallel-surface plane glass plate 3 of disc-like shape has a thickness t1 and another parallel-surface plane glass plate 4 of similar disk-like shape has a thickness t2 which is different from the thickness t1. These glass plates 3 and 4 are supported in a parallel relation by a frame 5. The frame 5 is disposed in or around an optical path extending between an imaging optical system (not shown) and an image surface 10 defined thereby, such that each of the surfaces of the glass plates 3 and 4, when they are flat, intersects an optical axis O of the imaging optical system perpendicularly. The frame 5 has inner supporting shoulders each extending along a circle having a center located on the optical axis O and having a radius a. By these supporting shoulders of the frame 5, the plane glass plates 3 and 4 are supported. The opposed surfaces of the glass plates 3 and 4 and a portion of an inner cylindrical wall of the frame 5 co-operate to define a closed space 6. In the state of FIG. 2A, the space 6 is in communication with the surrounding air by means of a throughbore 7 formed in the frame 5.

In the case of FIG. 2A, light 8 which is perpendicularly incident on the upper glass plate 3 emerges from the lower glass plate 4 with the direction and the position being maintained unchanged. That is, light 9 emerging from the glass plate 4 advances exactly along an extension of the light 8 incident on the glass plate 3. In the case of FIG. 2B, on the other hand, a pressure regulator 11 is coupled to the throughbore 7 so that the space 6 is in fluid-communication with an unshown pressurized-air supply source by way of the regulator 11. When air is supplied from the unshown source to the space 6 via the regulator 11 so that a pneumatic pressure Po is applied to the space 6, the glass plates 3 and 4 deform outwardly due to the difference between the pressure Po and ambient pressure (atmospheric pressure) Pa. The deformation of each of the glass plates 3 and 4 occurs symmetrically with respect to the center of support for the glass plate 3 or 4, i.e. with respect to the optical axis O. For this reason, light advancing along the optical axis O and entering the glass plates 3 and 4 is emitted from the glass plate 4 in the direction exactly along an extension of the direction of incidence. However, light 8' advancing in a direction parallel to the optical axis O and incident on the glass plate 3 at a position spaced from the optical axis O by a distance r is refracted at respective interfaces of the glass plates 3 and 4 since the surfaces of the glass plates 3 and 4 are curved or inclined by the deformation. Consequently, the emerging light advances in a direction parallel to the direction of incidence of the light 8', while being deviated radially therefrom by an amount $\delta$, such as depicted by numeral 9' in FIG. 2B. As will be seen also from the drawing, the amount of deviation $\delta$ is the function of the radial distance r and increases with the increase in the radial distance r.

In FIGS. 2A and 2B, the thickness and the amount of deformation of each of the glass plates 3 and 4 are exaggerated. Actually, the amount of deviation $\delta$ will be of an order not greater than 0.5 micron and both the thickness and the amount of deformation of the gloss plates are very small such as within the realm of the Thin-Plate Theory dealt with in the field of mechanics of materials.

Figure 3:
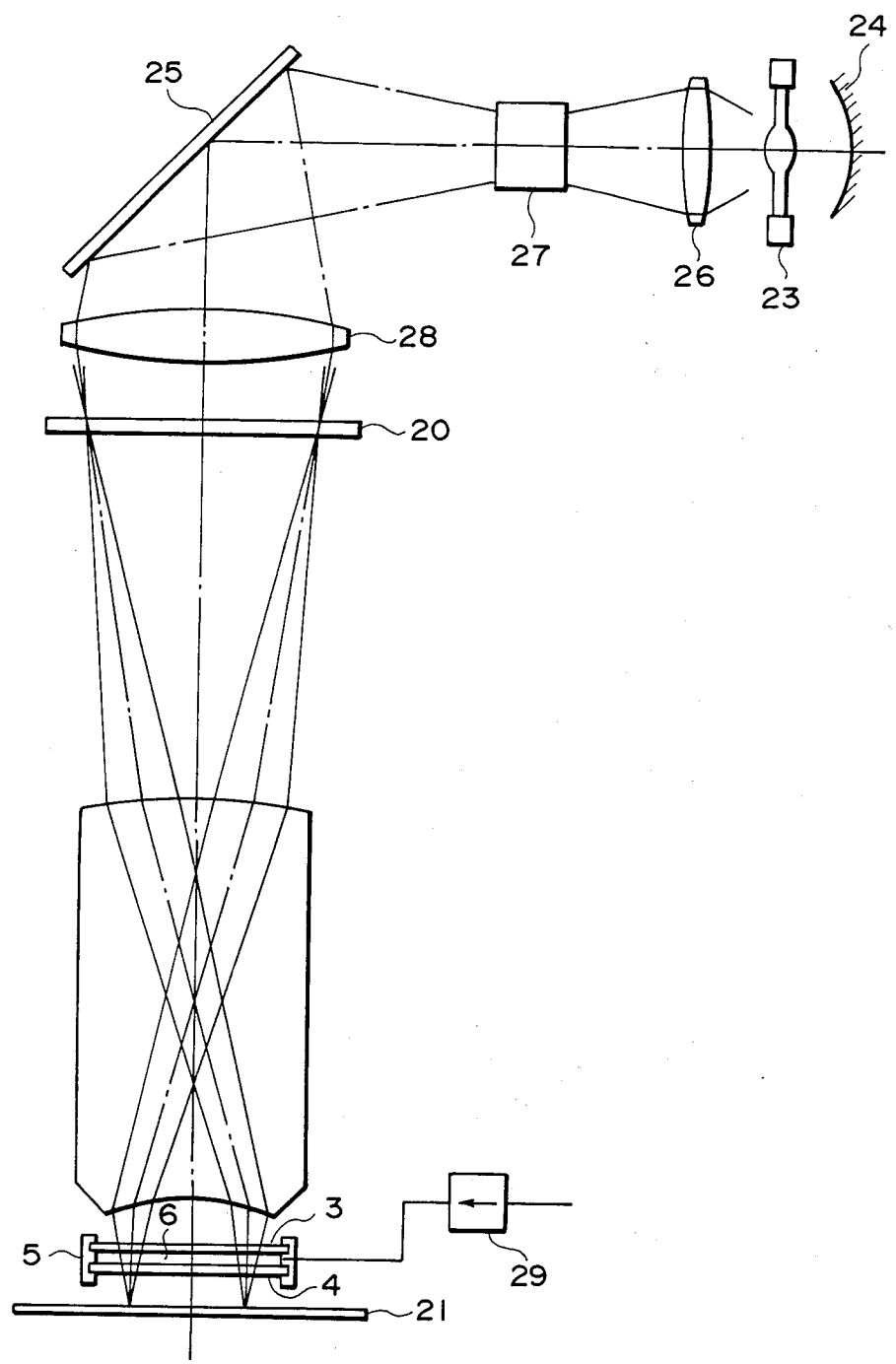
FIG. 3 is a schematic view of a semiconductor device manufacturing exposure apparatus of projection type into which a projection magnification adjusting device according to one embodiment of the present invention is incorporated.

FIG. 3 shows an example of a step-and-repeat type projection exposure apparatus (called "stepper") usable in the manufacture of semiconductor devices, into which apparatus the projection magnification adjusting device such as described with reference to FIG. 2B is incorporated. In FIG. 3, a reticle 20 has a pattern formed thereon and a semiconductor wafer 21 is disposed in the plane of an image surface defined by a projection lens system 22. By this projection lens system 22, an image of the pattern of the reticle 20 is projected onto the surface of the wafer 21 in a reduced scale. A lamp 23, mirrors 24 and 25 and lens systems 26-28 are provided which cooperate to irradiate the reticle 20 with light emitted from the lamp 23. By illuminating the reticle 20, the pattern of the reticle 20 is transferred onto the surface of the wafer 21. By repeating such pattern transfer and step-feeding of the wafer 21 (movement of the wafer 21 from a current-shot-area exposure position to the next-shot-area exposure position) in an alternating manner, images of the pattern of the reticle 20 are sequentially transferred onto different regions of the surface of the wafer 21 in the reduced scale. Parallel-surface plane glass plates 3 and 4 are held by a frame 5 and are disposed at a location on the optical path between the projection lens system 22 and the wafer 21, in the manner described hereinbefore. Usually, the projection lens system 22 used in the apparatus of the type described in the foregoing is telecentric on the image-surface side and, also, the light beam advancing toward the wafer 21 has a smaller diameter because the projection lens system is of reduction projection type. For these reasons, the additional optical system such as described above can be easily and suitably incorporated. Although the correcting optical system is additional, it is, needless to say, necessary to pay attention to the addition of such optical system, at the time of designing of the projection lens system 22, since the provision of the glass plates 3 and 4 changes the optical path length which results in displacement of the imaging position.

Diagrammatically illustrated pressure control system 29 is provided to control pressure in a space 6 defined by the glass plates 3 and 4 and the frame 5. By way of the pressure control system 29, air pressure or vacuum is supplied to the space 6 from an unshown pressurized-air source or an unshown vacuum source. And, by the supply of controlled air pressure or vacuum to the space 6, the glass plates 3 and 4 are deformed to correct or adjust the projection magnification of the projection lens system 22. As an alternative, the projection lens system 22 may be so arranged that the projection magnification thereof to be established under the ordinary ambient pressure (atmospheric pressure) is normally shifted from a desired projection magnification (e.g. 1/5) and, accordingly, the correcting device may be arranged so that the desired projection magnification is attained by the deformation of the glass plates 3 and 4 by respective preset amounts. This is preferable because it requires only one of the two kinds of deformation of the glass plates 3 and 4, i.e. outward convexity and inward convexity, in order to meet changes in the ambient pressure both in the positive direction and in the negative direction. The structure of the control system 29 can be made simple in this case. In other words, in such case, it is only necessary for the control system 29 to increase or, alternatively, reduce the pressure in the space 6.

Next, the principle of the present invention as illustrated in FIGS. 2A and 2B will now be theoretically analyzed, and an example which is suitable to effect magnification correction of a degree of 0.2-0.5 micron will be considered.

Deformation of a disc-like member when it receives uniformly distributed load can be expressed by the following equations, assuming that the pressure (difference between the supplied pressure and the ambient pressure) is P; the modulus of elasticity of the disc-like member is E; the thickness of the disc-like member is t; the Poisson's ratio of the disc-like member is $\nu$; the distance from the center of the disc-like member is r; the radial distance from the center of the disc-like member to the supporting point is a; and the amount of deformation of the disc-like member is y:

(for simple support)

$$y = (P/64D)\{pr^4 - [(2\nu+6)/(\nu+1)]a^2r^2 + [(\nu+5)/(\nu+1)]a^4\} \quad (1.1)$$

(for fixed support)

$$y = (P/64D)(r^4 - 2a^2r^2 - a^4) \quad (1.2)$$

wherein $$D = Et^3/12(1-\nu^2) \quad (1.3)$$

The angle of inclination $\theta$ is obtainable by differentiating, once, the amount of deformation y with respect to the distance r and, for the simple support:

$$\theta = dy/dr = (P/16D)\{r^3 - [(\nu+3)/(\nu+1)]a^2r\} \quad (2.1)$$

and for the fixed support:

$$\theta = dy/dr = (P/16D)(r^3 - a^2r) \quad (2.2)$$

On the other hand, the amount of deviation $\delta$ of the incident light due to the angle of inclination $\theta$ is expressed by the following equation, provided that the angle $\theta$ is within a narrow range:

$$\delta = t\theta(1-1/N) \quad (3.1)$$

wherein N is the refractive index of the glass material forming the disc-like member.

Substituting equations (2.1), (2.2) and (1.3) into equation (3.1) and arranging the resultant equation, then, the amount of deviation $\delta$ can be given by:

(for simple support)

$$\delta = \{3P(1-\nu^2)(1-1/N)/(4Et^2)\} \times \{r^3 - [(\nu+3)/(\nu+1)]a^2r\} \quad (4.1)$$

(for fixed support)

$$\delta = \{3P(1-\nu^2)(1-1/N)/4Et^2\}(r^3 - a^2r) \quad (4.2)$$

In the case shown in FIGS. 2A and 2B, the two glass plates 3 and 4 are deformed in the opposite directions. So, aside whether equation (4.1) or equation (4.2) is applicable, the overall deviation $\Delta\delta$ is given by:

$$|\delta(1st\ glass\ plate) - \delta(2nd\ glass\ plate)|$$

As will be apparent from equations (4.1) and (4.2), there are many coefficients for determining the deviation $\Delta\delta$. This is advantageous for the sake of optimization. For example, physical properties E, $\nu$ and N of the glass material constituting the disc-like member, the thickness t of the disc-like member and the radial distance a for the supporting point (hereinafter, simply "supporting radius") can be freely selected.

On the other hand, what is a matter to be considered in relation to equations (4.1) and (4.2) is the inclusion of a term of third order for "r". Unless such term is excluded, correction of magnification in the manner linearly proportional to "r" can not be achieved in a strict sense.

Figure 4:
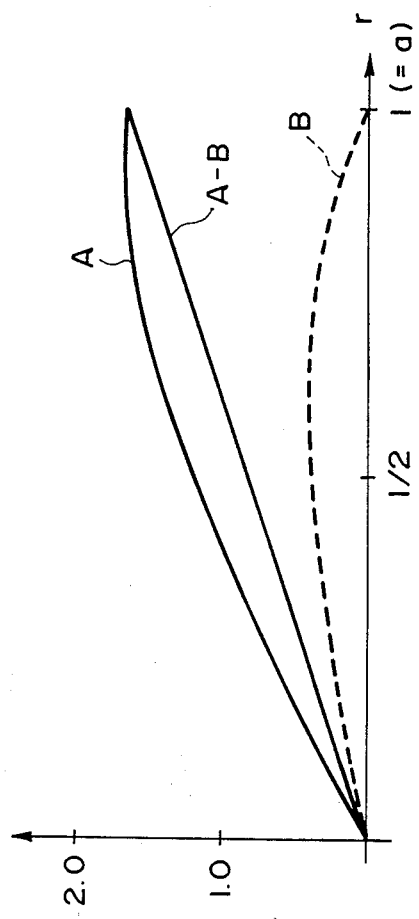
FIG. 4 is a graph showing the amount of deformation of a plane glass plate used in the embodiment of FIG. 3.

In the graph of FIG. 4, the lines or curves were obtained by plotting points corresponding to values $\{r^3 - (\nu+3)/(\nu+1)\}(=A)$, values $(r^3-ar)$ $(=B)$ and values concerning the difference between the first-mentioned values and the second-mentioned values $(=A-B)$. For the sake of such plotting, normalization was made with the supporting radius a=1 and the Poisson's ratio of the material BK-7 ($\nu$=0.207), one of ordinarily used optical glass materials, was selected as the value of the "$\nu$". It will be seen from FIG. 4 that the line A extends approximately rectilinearly where r is not greater than about 0.6, while the line B extends approximately rectilinearly where r is not greater than about 0.4. In other words, the first order term of "r" is dominant. From this, it is seen that setting the supporting point for the glass plate at such position that is spaced by a distance about 1.5 times or more larger than the radius of the effective light beam from the projection lens, is effective to alleviate or suppress the influence of "$r^3$". This is desirable also in respect to deformation of the glass plate due to stress at the supporting point.

Further, the most effective method for excluding the term of "$r^3$" is to make the two glass plates so as to have exactly the same physical properties E, $\nu$ and N, thickness t and supporting radius a, and to arrange the device so that one of the glass plates is simply supported while the other is fixedly supported. In such case, from equations (4.1) and (4.2), it follows that:

$$\Delta\delta = \delta_1 - \delta_2 \quad (5.1)$$
$$= \{[3P(1-\nu^2)(1-1/N)/4Et^2] \times [2/(\nu+1)]a^2r\}$$
$$= \{3P(1-\nu)(1-1/N)/2Et^2\}a^2r$$

Thus, the term of "$r^3$" is excluded. Also, the value of the supporting radius a does not affect the term "$r^3$". Accordingly, it is possible to further enlarge the coefficient for "r" by increasing the supporting radius $a_1$ at the simple support side as compared with the supporting radius $a_2$ at the fixed support side. Thus, $$\Delta\delta = K\{[(\nu+3)/(\nu+1)]a_1{}^2 - a_2{}^2\}r \quad (5.2)$$

wherein, $$K = \{3P(1-\nu^2)(1-1/N)\}/4Et^2 \quad (5.3)$$

For example, optical glass BK-7 (E=7980 kg/mm², $\nu$=0.207, N=1.526) is selected as for the material of the two glass plates; the thicknesses $t_1$ and $t_2$ of the two glass plates are made so that $t_1 = t_2 = 3$ mm; the supporting radii $a_1$ and $a_2$ for the glass plates are made so that $a_1 = a_2 = 40$ mm; and one of the glass plates is simply supported while the other is fixedly supported. Under these conditions, $\Delta\delta = 0.0913$ Pr. So, to cause deviation $\Delta\delta = 0.0003$ mm = 0.3 micron at the point of distance r = 10 mm, application of pressure 0.33 kg/cm² is sufficient. If $a_1 = 40$ mm and $a_2 = 25$ mm, then $\Delta\delta = 0.12$ Pr. Thus, application of pressure 0.24 kg/cm² is sufficient. These values are appropriate for the existing projection lens systems.

In the embodiment of FIG. 3, correction of the magnification error in the projection lens system 22 due to the change in ambient pressure is effected in such manner that, like a servo-controlled system, the ambient pressure is converted into an electric signal by use of a barometer and that the value of pressure to be applied to the correcting optical system is calculated on the basis of coefficient for magnification-to-ambient pressure in relation to the projection lens system 22 and coefficient for magnification-to-pressure in relation to the correcting optical system. And, by use of a servo-controlled valve or the like, the pressure which is controlled in accordance with the result of the calculation is applied to the closed space 6.

It is a possible alternative that the space 6 is exactly "closed" so that the glass plates 3 and 4 are deformed by the change in the ambient pressure itself, with the variation coefficient for the correction optical system (i.e. coefficient for magnification-to-pressure) and the variation coefficient of the projection lens system 22 (i.e. magnification-to-ambient pressure) being set in a relation that they have the same absolute values but have opposite signs. In such case, a slightly larger value will be necessary for "A" concerning the deviation $\Delta\delta = A$Pr. For this purpose, appropriate values can be suitably selected for "t", "E", "$\nu$", "N", etc. The thickness of the glass plate influences the correction of magnification at the rate of $1/t^2$, so selection of the thickness is effective. However, the glass plate can not be made so thin in view of the precision required as one of the components of the projection lens system 22. Also, physical properties such as E, $\nu$ and N can not be changed so radically because there are not so many kinds of optical glasses. Accordingly, in this case, it is an effective measure to make the glass plates 3 and 4 so as to have different thicknesses ($t_1 \neq t_2$), though the third order term "$r^3$" is included. It is a further alternative to provide one of the glass plates 3 and 4 by a plate-like member having a curved surface shaped so that significant deformation does not occur under the pressure to be established in the space 6.

Figure 5:
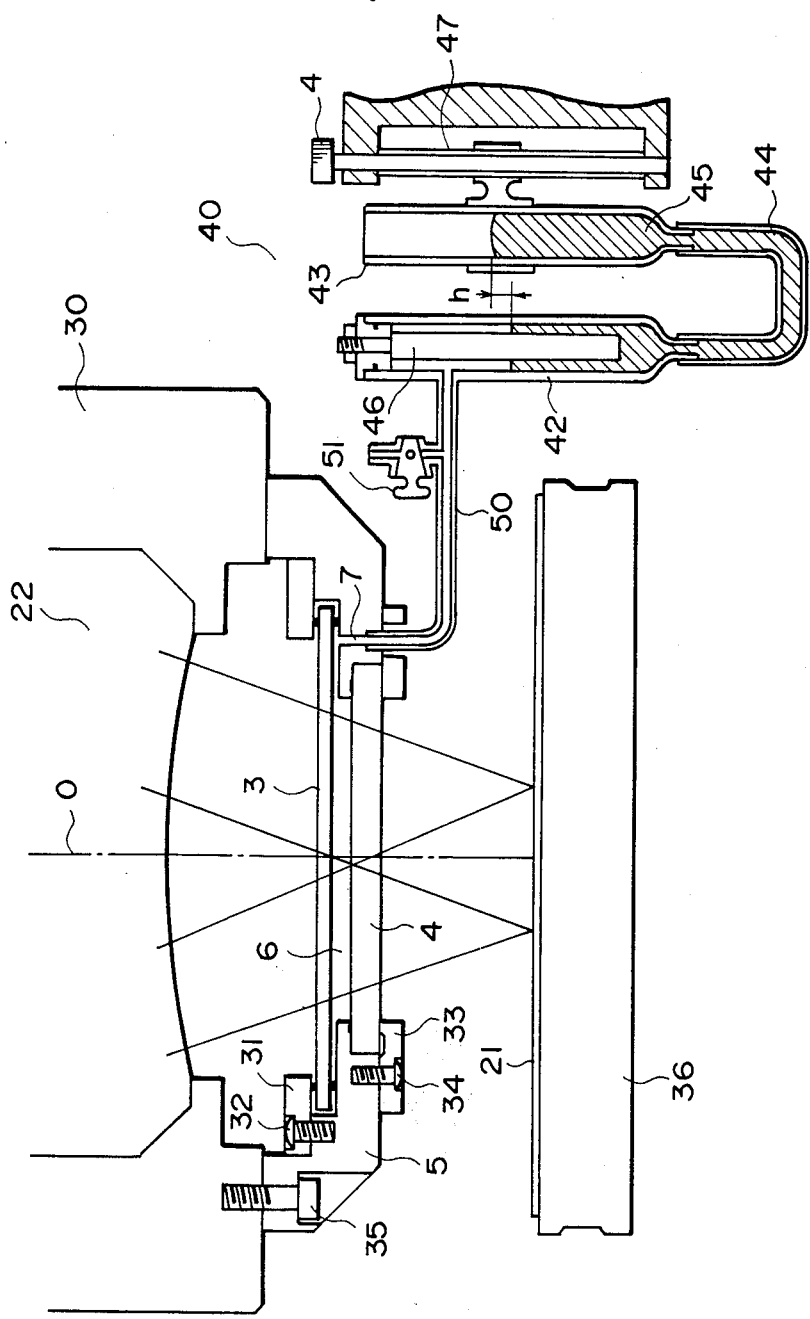
FIG. 5 is a fragmentary sectional view of a semiconductor device manufacturing exposure apparatus of projection type into which a projection magnification adjusting device according to another embodiment of the present invention is incorporated.

Referring now to FIG. 5, the manner of automatically correcting, by use of the ambient pressure itself, the error in the magnification of the projection lens system 22 due to the change in the ambient pressure will be described. In this embodiment, the projection lens system 22 is of the type in which the projection magnification increases with a decrease in the ambient pressure.

In FIG. 5, denoted by numeral 30 is a lens barrel for supporting the projection lens system 22; and by numerals 31 and 33, fitting elements for securing the glass plates 3 and 4 to the frame 5. The fitting elements 31 and 33 are fixed to the frame 5 by means of screws 32 and 34, respectively. The plane glass plate 3 at the lens 22 side is simply supported, while the plane glass plate 4 at the wafer 21 side is fixedly supported. The thickness t of the glass plate 3 is smaller than that of the glass plate 4, and the supporting radius a of the glass plate 3 is larger than that of the glass plate 4. At the support point on the glass plate 3, notches or grooves are formed by etching to receive sealing means. The frame 5 is fixedly secured to the barrel 30 by means of bolts 35, so that the glass plates 3 and 4 which are held in parallel to each other by the frame 5 are disposed in the optical path defined by the lens system 22, with their surfaces intersecting the optical axis O perpendicularly.

Denoted in this Figure by numeral 36 is a chuck for holding the wafer 21; and by numeral 40, a manometer for adjusting the pressure in the space 6. The manometer 40 comprises two tubular elements 42 and 43 whose lower end portions are connected to each other by way of a pipe 44. Thus, the manometer 40 generally has a U-shape. The manometer 40 comprising the tubular elements 42 and 43 and the connecting pipe 44 contains liquid 45 such as, for example, Hg. One (42) of the tubular elements of the manometer 40 is communicated with the space 6 by way of a pipe 50, while the other (43) of the tubular elements is open to atmosphere. Denoted by numeral 46 is an area adjusting rod for adjusting the cross-sectional area of the passage in the tubular element 43. Denoted by numeral 47 is an adjusting screw having a rotatable head 48. By rotating the head 48 to rotate the screw 47, the supporting height for the tubular element 43 is adjustable. A cock 51 is provided to adjust the pressure in the space 6.

If the space 6 is tightly closed, decrease in the ambient pressure leads to relative increase in the pressure within the space 6. So, each of the glass plates 3 and 4 deforms outwardly, thus reducing the projection magnification. On the other hand, since the projection lens system used is one in which the decrease in the ambient pressure enlarges the magnification of the projection lens system, the change in magnification by the deformation of the glass plates 3 and 4 and the change in magnification in the projection lens system itself cancel out. Therefore, by setting the above-described conditions (physical properties and the like) so as to avoid occurrence of magnification errors, a desired projection magnification can be retained irrespective of the change in ambient pressure. In this case, preferably the above-described conditions are set so that the amount of change in magnification by the glass plates 3 and 4 is slightly larger than an expected amount of change in magnification within the projection lens system 22 itself.

Figure 6:
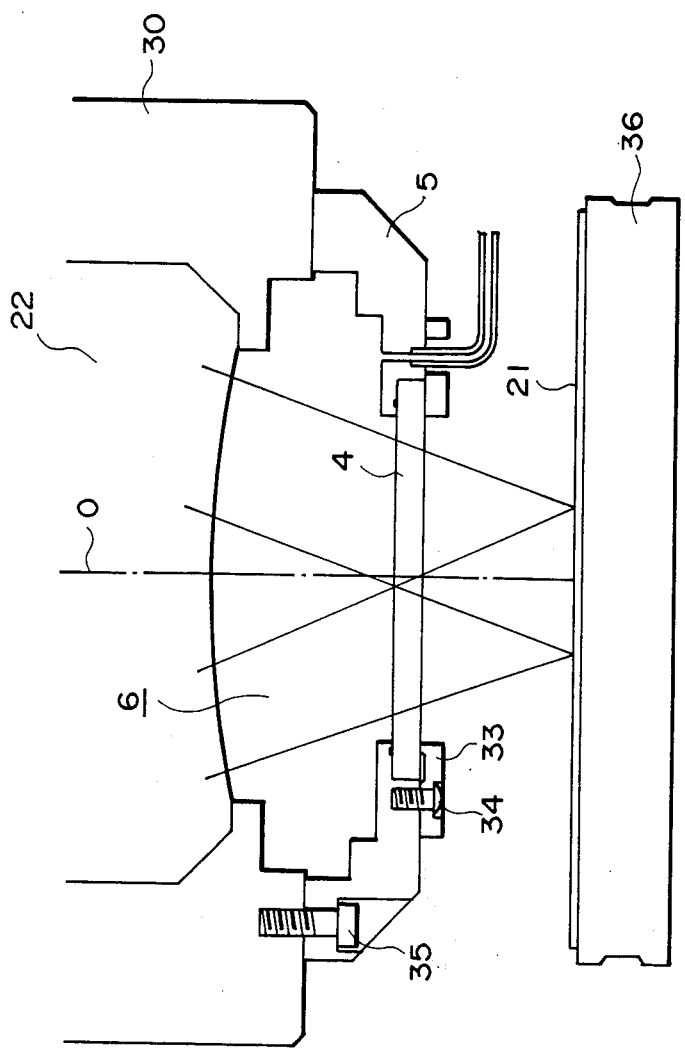
FIG. 6 is a view similar to FIG. 5 but showing a modification of the FIG. 5 embodiment.

FIG. 6 shows a modified form of the embodiment of FIG. 5. In the modification of FIG. 6, the closed space 6 is defined between a lens surface of the projection lens system 22 and the plane glass plate 4. Since the glass plate 4 is very thin as compared with the lens element of the projection lens system 22 having the lens surface contributable to define the space 6, only the glass plate 4 is deformable due to the difference between the ambient pressure and the pressure in the space 6.

Figure 7:
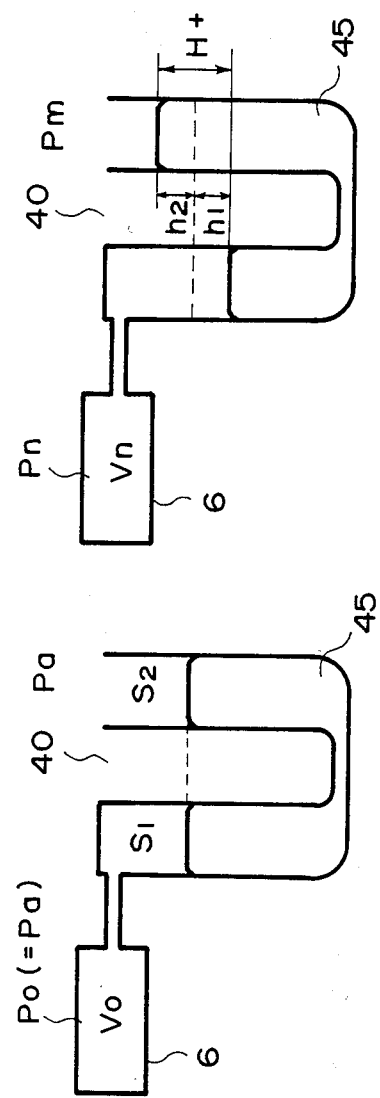
FIGS. 7A and 7B are principle views, respectively, showing the manner of adjustment of pressure in the embodiment of FIG. 5.

Referring now to FIGS. 7A and 7B, controllability of the pressure difference acting on the glass plates 3 and 4 will be described. In the state of FIG. 7A, the head of the manometer 40 is "zero", that is the pressure Po in the space 6 is equal to the ambient pressure Pa. It is assumed that the whole volume of the space 6 at this time is Vo, the cross-sectional area of one tubular element of the manometer 40 at the space 6 side is $S_1$, and the cross-sectional area of the other tubular element of the manometer which is open to the atmosphere is $S_2$. When the state of FIG. 7A is changed and, particularly, if the ambient pressure is decreased to a value Pm (Pa>Pm), the state becomes such as shown in FIG. 7B. At this time, the liquid columns show a difference corresponding to a head H, due to the influence of the internal pressure Pn. If the specific gravity of the liquid 45 is denoted by C, then the liquid columns balance according to the following equation:

$$Pn - Pm = C \times H \quad (6.1)$$

On the other hand, by pressing downwardly one of the liquid columns, the volume Vo is expanded to a value Vn. Therefore, the pressure Po is decreased to a value Pn. So, $$VoPo = VnPn = Pn(Vo + S_1 \times h_1) \quad (6.2)$$

Assuming $S_1 = S_2$, for the sake of simplification, then, $h_1 = h_2 = H/2$. Thus, from equations (6.1) and (6.2), it follows that:

$$Pm = \{Pn \, [(2 \times C \times Vo)/S](Po/Pn - 1)\} \quad (6.3)$$

Although equation (6.3) is not a linear one, the relation between the ambient pressure Pm and the differential pressure (Pm−Pn) acting on the glass plates 3 and 4 will be approximately linear in the range of expected change in the ambient pressure, if appropriate values are substituted into the coefficient.

Figure 8:
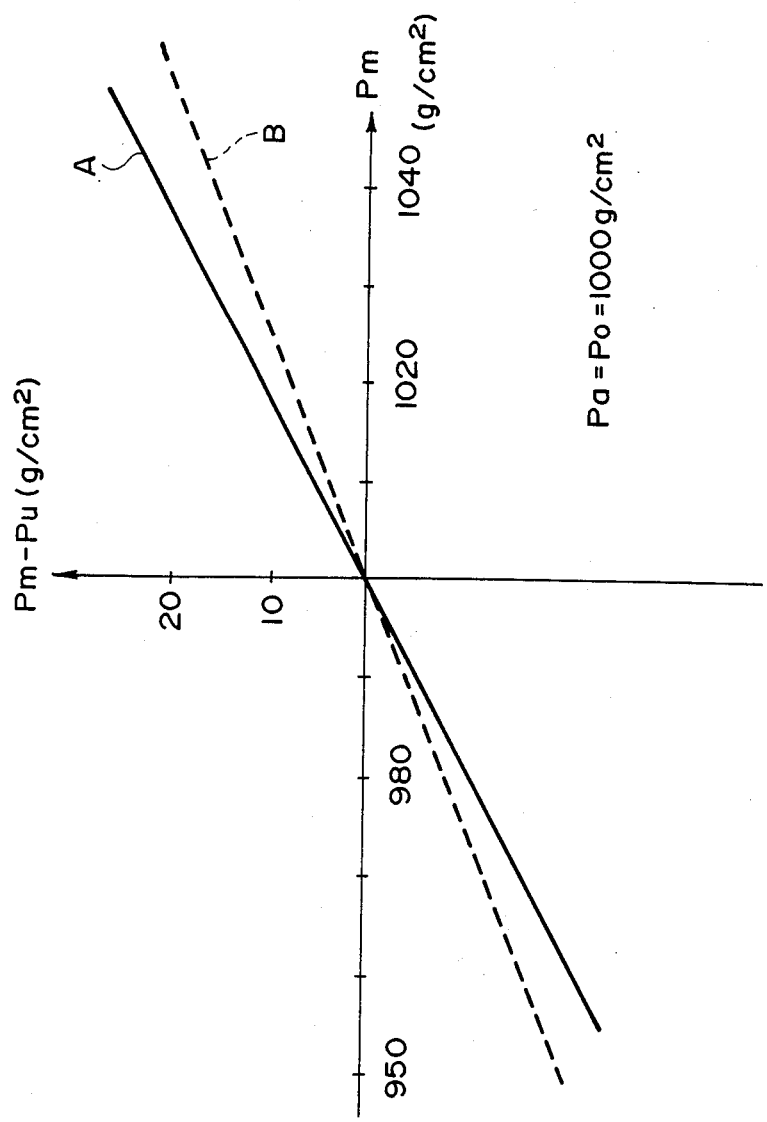
FIG. 8 is a graph showing the relation between the ambient pressure and the differential pressure, in the embodiment of FIG. 5.

FIG. 8 shows the relation between the ambient pressure Pm and the differential pressure (Pm-Pn) acting on the glass plates 3 and 4, under the condition that Pa=Po=1000 g/cm². Line A was obtained under the condition that Vo=18 cm³, C=13.6 g/cm³ and S=0.4 cm². Line B was obtained under the condition that Vo=10 cm³, C=13.6 g/cm³ and S=0.4 cm². As will be seen also from equation (6.3), the characteristic curve is changeable with the volume Vo of the space 6, the specific gravity C of the liquid 45 and the cross-sectional area S of the manometer 40. The volume Vo and the area S can be changed by replacing, by another, the adjusting rod provided in the tubular element 42 of the manometer 40. Also, by adjusting the cock 51 and the head 48 of the adjusting screw 47, the height of the liquid surface and the volume Vo of the space 6 can be adjusted finely.

In the manner described above, the coefficient for the change in pressure in the space 6, in relation to the change in ambient pressure, can be set as desired. As a result, the magnification change due to the change in ambient pressure can be automatically compensated for. Also, any error in the magnification due to an error in the manufacture of the projection lens system can of course be corrected by adjusting the position of the head 48 of the adjusting screw.

In accordance with the present invention, as has hitherto been described, an error in the projection magnification of a projection optical system can be corrected without adversely affecting other optical characteristics of the projection optical system. Also, when the present invention is applied to a semiconductor device manufacturing exposure apparatus of projection type, the error in the magnification of a projection lens system provided for projecting an image of a reticle onto a wafer, which error is caused by the change in ambient pressure, can be automatically corrected.

While the invention has been described with reference to the structures disclosed herein, it is not confined to the details set forth and this application is intended to cover such modifications or changes as may come within the purposes of the improvements or the scope of the following claims.

What is claimed is:

1. A device for adjusting magnification in projecting an image of a pattern of a first object onto a second object, said device comprising:
   means for optically projecting the image of the first object onto the second object;
   forming means for forming a substantially closed space at a position on an optical path of said projecting means and between the first and second objects, said forming means having at least one plane glass plate contributable to form said space; and
   adjusting means for changing pressure in said space to deform said at least one glass plate to thereby change the magnification of image projection.

2. A device according to claim 1, wherein said forming means forms said space at a position between said projecting means and the second object.

3. A device according to claim 1, wherein said projecting means has a lens element and wherein said glass plate of said forming means co-operates with a surface of said lens element of said projecting means to form said space.

4. A device according to claim 1, wherein said forming means includes a plurality of plane glass plates disposed substantially in parallel to each other, and wherein said space is formed by said plane glass plates.

5. A device according to claim 4, wherein said plane glass plates have different thicknesses.

6. A device according to claim 4, wherein said plane glass plates are supported at respective positions thereon having different radial distances from the optical axis of said projecting means.

7. A device according to claim 6, wherein said forming means is arranged so that one of said glass plates supported at a larger radial distance is supported simply and another of said glass plates supported at a smaller radial distance is supported fixedly.

8. A device according to claim 6, wherein each of the radial distances for the support of said glass plates is 1.5 times or more larger than the radius of an effective light from said projecting means.

9. A device according to claim 1, wherein said adjusting means is adapted to deform said glass plate in accordance with the difference between the pressure in said space and ambient pressure to maintain the magnification of image projection constant.

10. A device according to claim 9, wherein said adjusting means includes a tubular member having a substantially U-shape having an end communicated with said space and another end open to the ambient pressure, and wherein liquid is contained in said tubular member.

11. A device according to claim 10, wherein said tubular member has a passage formed therein whose cross-sectional area is adjustable.

12. A device according to claim 1, wherein said glass plate has a disc-like shape.

13. An apparatus comprising:
means for exposing, with radiation, a first object to a pattern of a second object so as to transfer the pattern of the second object onto the first object;

forming means for forming a substantially closed space at a position on a path of the radiation defined by said exposing means and between the first and second objects, said forming means having at least one plane glass plate contributable to form said space; and adjusting means for deforming said glass plate with a change in pressure in said space to change magnification in the transfer of the pattern of the second object onto the first object.

* * * * *

UNITED STATES PATENT AND TRADEMARK OFFICE
CERTIFICATE OF CORRECTION

PATENT NO. : 4,676,631
DATED : June 30, 1987
INVENTOR(S) : MASAO KOSUGI, ET AL.

It is certified that error appears in the above-identified patent and that said Letters Patent is hereby corrected as shown below:

COLUMN 4

Line 16,   "gloss" should rad --glass--.

COLUMN 7

Line 26,   "that" should be deleted.

COLUMN 9

Line 32,   "Pm={Pn[(2xCxVo)/S](Po/Pn-1)}" should read --Pm={Pn-[(2xCxVo)/S](Po/Pn-1)}--.

COLUMN 10

Line 4,   "prbjection" should read --projection--.

Signed and Sealed this

Seventeenth Day of November, 1987

Attest:

DONALD J. QUIGG

Attesting Officer            Commissioner of Patents and Trademarks